United States Patent
Lelong et al.

(10) Patent No.: US 8,359,177 B2
(45) Date of Patent: Jan. 22, 2013

(54) MULTICARRIER REFLECTOMETRY DEVICE AND METHOD FOR ON-LINE DIAGNOSIS OF AT LEAST ONE TRANSMISSION LINE

(75) Inventors: Adrien Lelong, Orsay (FR); Marc Olivas, Palaiseau (FR)

(73) Assignee: Commissariat a l'énergie atomique et aux énergies alternatives, Paris (FR)

( * ) Notice: Subject to any disclaimer, the term of this patent is extended or adjusted under 35 U.S.C. 154(b) by 288 days.

(21) Appl. No.: 12/936,929

(22) PCT Filed: May 12, 2009

(86) PCT No.: PCT/EP2009/055696
§ 371 (c)(1), (2), (4) Date: Oct. 8, 2010

(87) PCT Pub. No.: WO2009/138391
PCT Pub. Date: Nov. 19, 2009

(65) Prior Publication Data
US 2011/0035168 A1    Feb. 10, 2011

(30) Foreign Application Priority Data
May 14, 2008  (FR) ..................... 08 53114

(51) Int. Cl.
*G01R 13/00* (2006.01)
(52) U.S. Cl. ......................................................... 702/66
(58) Field of Classification Search .................... 702/66
See application file for complete search history.

(56) References Cited

U.S. PATENT DOCUMENTS

| | | |
|---|---|---|
| 2002/0161539 A1 | 10/2002 | Jones et al. |
| 2002/0161542 A1 | 10/2002 | Jones et al. |
| 2002/0169585 A1 | 11/2002 | Jones et al. |
| 2003/0043894 A1* | 3/2003 | Sestok et al. ................. 375/219 |

FOREIGN PATENT DOCUMENTS
WO    02 078239    10/2002

OTHER PUBLICATIONS

International Search Report issued Aug. 24, 2009 in PCT/EP09/55696 filed May 12, 2009.
Naik Suketu et al., "Multicarrier Reflectometry", IEEE Sensors Journal, vol. 6, No. 3, pp. 812-818, XP002507430, ISSN: 1530-437X, (Jun. 2006).

(Continued)

*Primary Examiner* — Tung S Lau
(74) *Attorney, Agent, or Firm* — Oblon, Spivak, McClelland, Maier & Neustadt, L.L.P.

(57) ABSTRACT

A multi-carrier reflectometry device and method for on-line diagnosis of at least one transmission line. The device includes: a transmission part that includes successively: a module for parameterizing a test signal $S_F$, such that:

$$s_F = [0, c_1 e^{j\theta_1}, c_2 e^{j\theta_2}, \ldots, C_{N/2-1} e^{j\theta_{N/2-1}}, C_{N/2}, C_{N/2-1} e^{j\theta_{N/2-1}}, C_{N/2-2} e^{j\theta_{N/2-2}}, \ldots, c_1 e^{j\theta_1}]^T,$$

a module for synthesizing the test signal by inverse discrete Fourier transform, and a digital to analog converter, connected to the line; and a detection part that includes successively: an analog to digital converter connected to this transmission line, a discrete Fourier transform module, and an analysis module containing a deconvolution module, which also receives the test signal $s_F$.

16 Claims, 4 Drawing Sheets

OTHER PUBLICATIONS

Farhang-Boroujeny, B. et al., "Transfer Function Identification with Filtering Techniques", IEEE Transactions on Signal Processing, vol. 44, No. 6, pp. 1334-1345, XP002539218, ISSN: 1053-587X, (Jun. 1996).

Buccella, Concettina et al., "Detection and Localization of Defects in Shielded Cables by Time-Domain Measurements With UWB Pulse Injection and Clean Algorithm Postprocessing", IEEE Transactions on Electromagnetic Compatability, vol. 46, No. 4, pp. 597-605, XP011122832, ISSN: 0018-9375, (Nov. 2004).

Jones, W. William et al., "Sequence Time Domain Reflectometry(STDR) for Digital Subscriber Line Provisioning and Diagnostics", pp. 1-8, XP002203227, (2001).

* cited by examiner

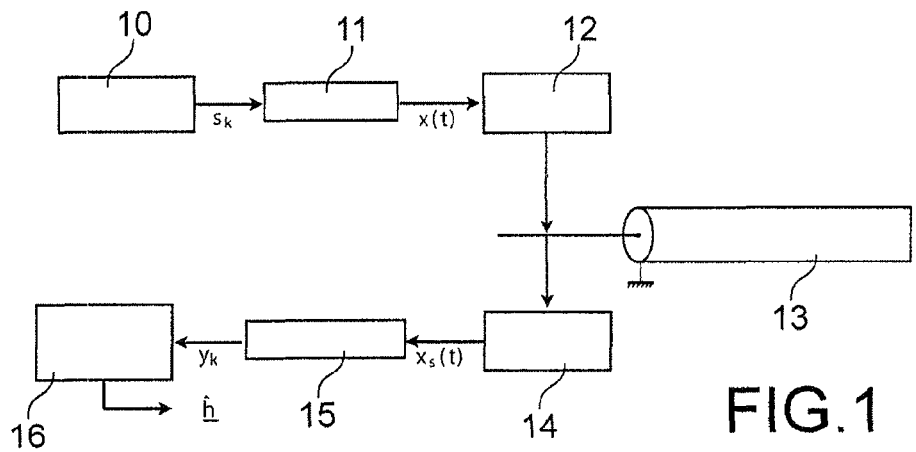
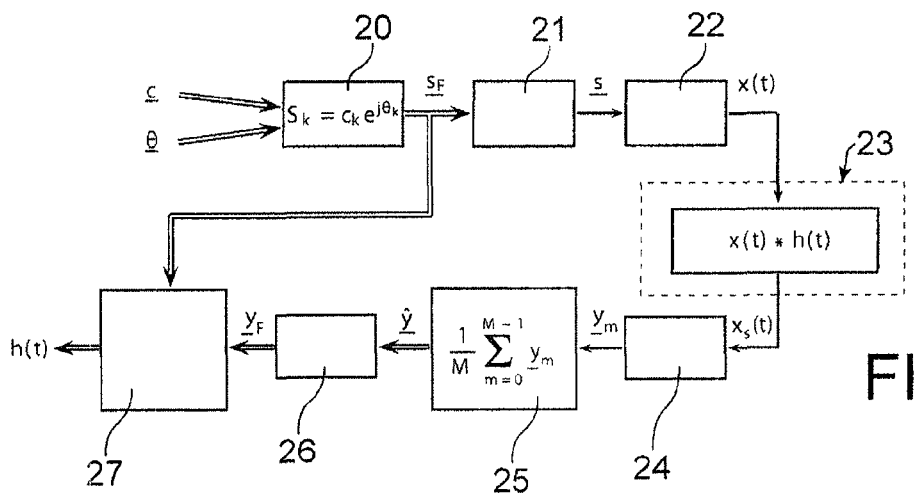
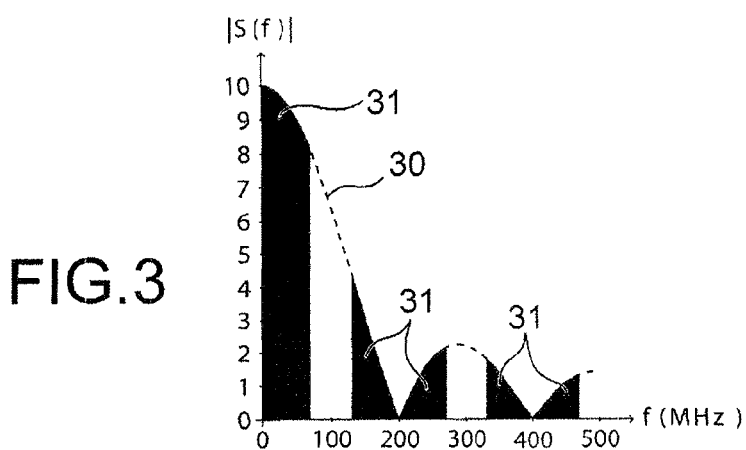

MULTICARRIER REFLECTOMETRY DEVICE AND METHOD FOR ON-LINE DIAGNOSIS OF AT LEAST ONE TRANSMISSION LINE

TECHNICAL FIELD

The invention concerns a multicarrier reflectometry device and method for on-line diagnosis of at least one transmission line, for example in a cable network.

The field of the invention is in particular that of the on-board diagnosis of cable networks by reflectometry.

PRIOR ART

The purpose of reflectometry is to trace abrupt variations in the characteristic impedance of one or more transmission lines that may correspond to branches or faults (short-circuit, or open circuit), by determining the coefficients of reflection $\alpha_k$ of the line or lines.

The principle of reflectometry is based on the propagation of voltage waves in these lines. It consists of sending a known signal x(t) in an electrical line and then measuring the signal $x_s(t)$ returned by the line. The measurement that is made is then composed of all the echoes due to the variations in the characteristic impedance of the line. Analysis of the measurement $x_s(t)$ compared with the original line x(t) gives an estimation of the line response.

The diagram in FIG. 1 illustrates the general functioning of a reflectometry device. This figure shows:
  a transmission part that comprises:
    a shape generator 10,
    a digital to analogue converter 11,
    a first electrical coupling device 12 connected to the line to be diagnosed 13,
  a detection part that comprises:
    a second electrical coupling device 14 connected to the line 13,
    an analogue to digital converter 15,
    a device for averaging and processing the signal 16.

The signal x(t) sent over the line 13 by the transmission part is subject to constraints particular to the application and to the reflectometry method used. The role of the electrical coupling is to produce the interfacing between the reflectometry device (transmission, reception of signal) and the line 13 by fulfilling functions such as impedance matching, electrical protection or optionally filtering.

The relationship between $x_s(t)$ and x(t) is given by the equation: $x_s(t)=x(t)*h(t)$, * representing the convolution product. In the frequency domain the equation: $X_s(f)=X(f)H(f)$ is obtained.

h(t) comprises a series of pulses of the Dirac type such that:

$$h(t)=\Sigma\alpha_k\delta(t-\tau_k) \quad (1)$$

The purpose of the reflectometry device is to measure, with maximum precision, this signal h(t), which is referred to as the "line response".

With a network of cables, the reflectometry consists of sending a signal over this network of cables and then measuring the echoes returned. The delay and amplitude of these echoes makes it possible to obtain information on the structure or electrical defects present in this network. More generally, each echo corresponds to a singularity. It is thus possible to locate, characterise and possibly predict a breakdown. The well known conventional reflectometry methods are TDR ("Time Domain Reflectometry") and FDR ("Frequency Domain Reflectometry").

When it is wished to make an on-line diagnosis, the reflectometry signals are sent over the network when the target system is operating. This makes it possible to establish a much more thorough diagnosis of the network since these are the actual operating conditions of the system. In addition, it is possible to detect transient faults. It is however necessary to avoid any interference between the signals relating to the functioning of the target system and the reflectometry. This gives rise to various constraints (variable from one application to another) with regard to EMC (electromagnetic compatibility), spectral occupation of the signals or robustness to noise. Specific reflectometry techniques must therefore be implemented to adapt to these constraints.

Several reflectometry methods of the prior art make it possible, in some applications, to respond to the constraints of an on-line diagnosis. The following can be cited:
  STDR ("Sequence Time Domain Reflectometry"), as described in the document referenced [1] at the end of the description: this method is also advantageous for off-line (or non-connected) diagnosis. It makes it possible to reduce the amplitude of the signal sent while keeping the same performance as conventional TDR reflectometry. It can be implemented in a digital system.
  SSTDR ("Spread Spectrum Time Domain Reflectometry"), as described in the document referenced [1]: this method, based on STDR reflectometry, makes it possible to shift the spectrum of the signal sent by means of the addition of an analogue part, which makes it possible to reduce the power injected in the low frequencies. However, the spectral occupation is twice as great as with STDR reflectometry and the spectrum can just be shifted but not deformed.
  NDR ("Noise Domain Reflectometry"), as described in the document referenced [2]: this method makes it possible to carry out reflectometry without sending any signal. It is the signals already present on the line that are used. Although this method may be advantageous in some cases, it has major drawbacks:
    The signals present in the cable network must have suitable properties.
    The processing operations are more complex.
    The test signals are not periodic, which has consequences for the complexity of the processing and the quality of the measurement.
  MCR ("MultiCarrier Reflectometry"), as described in the document referenced [3]: the advantage of this method using multicarrier signals is the great flexibility with which it is possible to modulate the spectrum of the signal sent, which also makes it possible to adapt to constraints particular to on-line diagnosis. For example, though there is a prohibition on transmitting on a frequency band situated at the middle of the test signal spectrum, it is entirely possible to cancel out the energy of the signal on this frequency band. The method proposed does however remain very limited since it makes it possible to diagnose only lines that are simple and uniform.

These methods of the prior art known for on-line diagnosis suffer from a lack of flexibility in terms of parameterising. Thus these methods do not always make it possible to adapt to the constraints of the applications for such an on-line diagnosis. One of the important aspects of on-line diagnosis is the spectral occupation of the test signal sent over the cable network. This is because the spectrum of the signal must firstly satisfy the EMC standards of the application and secondly make it possible to limit the interference with the functioning of the application.

The purpose of the invention is to overcome these drawbacks and to enable on-line diagnosis that can be applied to a completely arbitrary electrical network topology.

DISCLOSURE OF THE INVENTION

The invention concerns a multicarrier reflectometry device for on-line diagnosis of at least one transmission line, characterised in that it comprises:

a transmission part connected to this transmission line, which comprises successively:

a module for parameterising a test signal $S_F$, such that:

$$s_F = [0, c_1 e^{j\theta_1}, c_2 e^{j\theta_2}, \ldots, c_{N/2-1} e^{j\theta_{N/2-1}}, c_{N/2}, c_{N/2-1} e^{j\theta_{N/2-1}}, c_{N/2-2} e^{j\theta_{N/2-2}}, \ldots, c_1 e^{j\theta_1}]^T$$

a module for synthesising this test signal by inverse discrete Fourier transform, a digital to analogue converter, connected to this transmission line, which delivers to the latter an analogue test signal x(t) that is a periodic signal, a detection part, connected to this transmission line, which comprises successively:

an analogue to digital converter, connected to this transmission line, and which receives a measured signal $x_s(t)$ and digitises it, a discrete Fourier transform module, an analysis module containing a deconvolution module, which performs a post-processing of the measured signal thus transformed using the test signal $S_F$ and makes it possible to estimate the transmission response h(t), such that $x_s(t)=x(t)*h(t)$, * representing the convolution product.

Advantageously, the invention concerns a device in which the analysis module comprises means of intercorrelation between the signal sent and the signal measured. The analysis module can comprise post-processing means. The post-processing means can effect a raw deconvolution by applying the following equation:

$$h_k^F = \frac{y_k^F}{s_k^F}$$

where $h_k^F$, $y_k^F$, and $s_k^F$ correspond respectively to the samples of the vectors $\hat{h}_F$, $y_F$ and $s_F$, discrete Fourier transforms of the vectors $\hat{h}$, $\overline{y}$ and s, each period of the measured signal $x_s(t)$ making it possible to obtain a series of vectors $y_m$ of length N, the average obtained by an averaging of several periods being stored in a vector $\underline{y}$. The post-processing means can produce a cleaning algorithm, which comprises steps of:

initialisation,
search for the maximum,
cleaning after a stoppage condition test,
storage.

The analogue to digital converter can comprise supersampling means. Analogue filtering means can be inserted after the digital to analogue converter.

The invention also concerns a multicarrier reflectometry method for the on-line diagnosis of at least one transmission line, characterised in that it comprises the following steps:

in transmission in this transmission line:

a step of parameterising a test signal $S_F$ such that:

$$s_F = [0, c_1 e^{j\theta_1}, c_2 e^{j\theta_2}, \ldots, c_{N/2-1} e^{j\theta_{N/2-1}}, c_{N/2}, c_{N/2-1} e^{j\theta_{N/2-1}}, c_{N/2-2} e^{j\theta_{N/2-2}}, \ldots, c_1 e^{j\theta_1}]^T$$

a step of synthesising this test signal by inverse discrete Fourier transform, a step of digital to analogue conversion that delivers to this transmission line an analogue test signal x(t) that is a periodic signal, in detection for this transmission line:

a step of analogue to digital conversion of the measured signal $x_s(t)$ connected to this transmission line, an optional averaging step, a discrete Fourier transform step, an analysis step enabling a deconvolution, which effects a post-processing of the signal thus transformed using the test signal $S_F$ and makes it possible to estimate the response h(t) of the transmission line, such that $x_s(t)=x(t)*h(t)$, * representing a convolution product.

Advantageously, the invention also concerns a method in which the analysis step comprises a phase of inter-correlation between the signal sent and the signal measured. The analysis step may comprise a post-processing phase. The post-processing phase may effect a raw deconvolution by applying the following equation:

$$h_k^F = \frac{y_k^F}{s_k^F}$$

where $h_k^F$, $y_k^F$, and $s_k^F$ correspond respectively to the samples of the vectors $\hat{h}_F$, $y_F$ and $s_F$, discrete Fourier transforms of the vectors $\hat{h}$, $\overline{y}$ and s, each period of the measured signal $x_s(t)$ making it possible to obtain a series of vectors $y_m$ of length N, the average obtained by an averaging of several periods being stored in a vector $\underline{y}$. The post-processing step can produce a cleaning algorithm, which comprises steps of:

initialisation,
search for the maximum,
cleaning after a stoppage condition test,
storage.

The analogue to digital conversion step can comprise a supersampling phase. An analogue filtering phase may be introduced after the digital to analogue conversion step.

Advantageously, the analysis module used in the device of the invention concerns a deconvolution module the signal model used of which is independent of the topology of the network diagnosed. Unlike the multicarrier reflectometry method presented in the document referenced [3], which makes it possible to diagnose only lines that are simple (i.e. without junction) and uniform (i.e. without impedance variations) because of the model used, the present invention makes it possible to diagnose complex cable networks including several junctions as well as non-uniform lines.

Deconvolution methods such as this one have not been used in the known prior art for post-processing multicarrier reflectometry signals. In the invention, this deconvolution is performed by means of a raw deconvolution algorithm (which consists of a spectral division) or a cleaning algorithm or both according to the parameters of the test signal generated. In addition, the objective of such a cleaning algorithm in the document referenced [5] is increasing the precision of the measurement. In the present invention, the objective is to estimate the missing information in the measurement. This missing information corresponds to the frequency bands where the energy of the test signal is zero. However, the cancelling (or reduction) of the energy in these frequency bands enables the system to adapt to the EMC (electromagnetic compatibility) constraints of the application. This is the objective of multicarrier reflectometry.

The invention therefore proposes an overlayer of the STDR enabling the objective sought to be achieved, namely the application of multicarrier reflectometry to complex networks in order to be able to perform a diagnosis in compliance with the arbitrary EMC constraints.

The step of post-processing of the reflectometry signal is of fairly low complexity, which enables easy integration of the method of the invention in an embedded system. Moreover, the method of the invention is entirely digital, which gives it a clear advantage compared with SSTDR reflectometry.

Numerous applications of the device and method of the invention are possible, in particular in the automobile, avionics, etc fields.

BRIEF DESCRIPTION OF THE DRAWINGS

FIG. 1 illustrates a block diagram of a reflectometry diagnosis device of the prior art.

FIG. 2 illustrates an outline diagram of the multicarrier reflectometry device according to the invention.

FIG. 3 illustrates the spectrum of the test device obtained by cancelling out the coefficients $c_i$ on the FM band.

DETAILED DISCLOSURE OF PARTICULAR EMBODIMENTS

Figure 4:
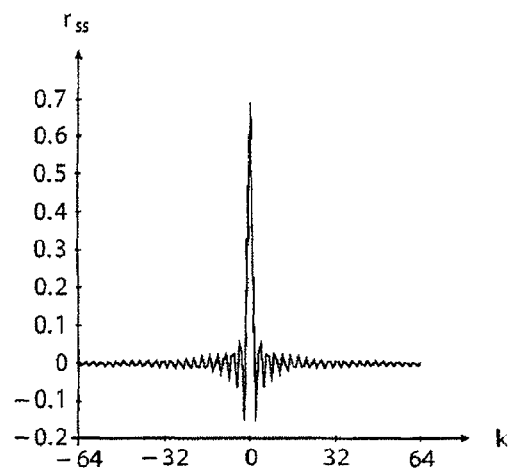
FIG. 4 illustrates an example of an auto-correlation function of a multicarrier signal.

The multicarrier reflectometry device for on-line diagnosis of at least one transmission line according to the invention is illustrated in the diagram in FIG. 2.

This device comprises:
a transmission part that comprises successively:
a module 20 for parameterising a test signal $S_F$, through vectors $\underline{c}$ and $\underline{\theta}$ such that:

$$\underline{c}=[c_0,c_1,\ldots c_{N/2}]^T \text{ and } \underline{\theta}=[\theta_0,\theta_1,\ldots,\theta_{N/2}]^T \tag{2}$$

which delivers this test signal, which contains complex values and is such that:

$$s_F=[0,c_1e^{j\theta_1},c_2e^{j\theta_2},\ldots,c_{N/2-1}e^{j\theta_{N/2-1}},c_{N/2},c_{N/2-1}e^{j\theta_{N/2-1}},c_{N/2-2}e^{j\theta_{N/2-2}},\ldots,c_1e^{j\theta_1}]^T \tag{3}$$

a module 21 for synthesising this test signal by inverse discrete Fourier transform (IDFT),
a digital to analogue converter 22 connected to the line 23,
a detection part that comprises successively:
a analogue to digital converter 24 connected to the line 23,
a optional averaging module 25,
a discrete Fourier transform module 26,
an analysis module 27 than also receives the signal $s_F$.

The multicarrier reflectometry according to the invention enables to spectrum of the test signal to be modulated according to a given specification, and satisfies the constraints related to the interference between the reflectometry and the functioning of the target system. The signal transmitted can be written $$s(kT_e) = \sum_{n=1}^{N/2} c_n \cos\left(\frac{2\pi n}{N}k + \theta_n\right) \tag{4}$$

$$Te = \frac{1}{F_e}$$

is the sampling frequency.

$N/2$ corresponds to the number of sinusoids.
$c_n \in R^+$ is the amplitude of the $n^{th}$ sinusoid.
$\theta_n$ is the phase of the $n^{th}$ sinusoid.

The test signal defined by equation (4) is synthesised by the inverse discrete Fourier transform. The vector s contains the samples of a period of the signal. The vector $s_F$ corresponds to the discrete Fourier transform of the vector s. The test signal is parameterised through the vectors $\underline{\theta}$ and $\underline{c}$, defined above. The digital to analogue converter 11 and analogue to digital converter 15 implement the interface between the digital part of the device containing the calculation algorithms and the analogue input-output part.

After the inverse discrete Fourier transform 21 the vector s is obtained, all the values of which are real. This vector defines the test signal to be sent over the line 23. This test signal is an analogue signal x(t), obtained after passage through the digital to analogue converter 22, which is a periodic signal of period $$T = \frac{N}{F_e}.$$

The measured signal x(t) (also of period T) is digitised by the analogue to digital convertor 24. Each measured period makes it possible to obtain a sequence of vectors $y_m$ of length N. In order to maximise the signal to noise ratio as far as possible, it is possible to perform an averaging 25 of several periods. The average obtained is stored in a vector y. This possibility of averaging, which is based on the periodic character of the signal measured, would not be applicable in the case of NDR reflectometry. For reasons of speed of calculation, the analysis algorithms work on the Fourier transform of the vector y designated by the vector $y_f$. In order actually to profit from this rapidity of calculation, while profiting from the possibility of calculating the Fourier transform, a number N of samples of a period that is a power of 2 is used (i.e.: $N=2^k$, $k \in N^*$).

The analysis algorithm used in the analysis module 27 is different depending on whether or not all the coefficients $c_i$ are zero.

Parameterising of the Test Signal (Module 20)

Parameterising of the test signal, which is sent over the line 23, makes it possible to adapt the device of the invention to the constraints of the required application. The coefficients $C_i$ of the vector $\underline{c}$ determine the distribution of the energy of the signal over the spectrum and have an impact on the quality of the measurement. The parameters $\theta_i$ of the vector $\underline{\theta}$ theoretically have no influence on the quality of the measurement. On the other hand these parameters determine the dynamic range of the test signal, that is to say the peak to peak amplitude.

The spectrum of the test signal x(t) theoretically extends to infinity, but the various filtering phenomena encountered mean that, in practice, it can be considered to be negligible beyond the sampling frequency $F_e$. The spectrum of this test signal x(t) on the frequency band $[0, F_e]$ is given by $$|S(f)| = \sum_{n=1}^{N/2} c_n \left[ \delta_{\frac{F_e n}{N}}(f) + \delta_{\frac{F_e(1-n)}{N}}(f) \right] |\mathrm{sinc}(\pi f T_e)| \quad (5)$$

The symbol $\delta_{f_c}(f)$ designates a Dirac pulse the peak of which is situated at the frequency $f_c$.

The coefficients $\theta_i$ of the vector $\underline{\theta}$ can be calculated in various ways:

Thus they can be generated randomly. However this case is fairly far from optimum.

They can also be calculated using the Shroeder algorithm described in the document referenced [4]. Such a solution is acceptable in terms of dynamic range. In addition, the algorithm used is simple, which facilitates application thereof.

Finally, it is possible to use other more complex methods that make it possible to obtain solutions closer to optimum (the amplitude is still smaller). However, the gain obtained does not necessarily justify the use of such methods.

In the case of the method described in the document referenced [3], the phases are simply generated randomly.

1) Example of Parameterising of the Coefficients $c_i$

In an example embodiment, the sampling frequency $F_e$ is 200 MHz and it is wished to cancel out the spectrum of the signal on the band [70-130 MHz] (which contains the FM band). The length of the signal is N=512. There are therefore 256 parameters $c_i$ to be defined. The Shannon frequency $F_e/2$=100 MHz is situated at the middle of the band in question. It therefore suffices to cancel out the spectrum from 70 MHz to 100 MHz and the other part of the band is cancelled out by spectral aliasing. The index of the element of the vector corresponding to $F_0$=70 MHz is:

$$N_0 = N \frac{F_0}{F_e} = 179$$

The vector $\underline{c}$ is defined by $$c_n = \begin{cases} 0 & \text{for } n \in \{179, \ldots, 256\} \\ 1 & \text{otherwise} \end{cases} \quad (6)$$

The spectrum of the test signal s(t) obtained is shown in FIG. 3. On this graph the broken line 30 represents the spectrum of a multicarrier signal when all the coefficients $c_i$ are equal to 1, and the shaded surface 31 represents the spectrum of the signal obtained by cancelling out the coefficients on the FM band.

Analysis of the Reflectometry Signal (Module 27)

In the case where all the values of the vector c are equal to 1, the device of the invention is equivalent to an STDR reflectometry. This is because, in this case, the spectral power density (SPD) of the multicarrier signal is the same as that of a pseudorandom noise of the MSequence type. A simple intercorrelation of the measured signal with the transmitted signal makes it possible to obtain the correct estimation of the response of the line h(t).

The intercorrelation is calculated using the discrete Fourier transform that enables more rapid calculation when N is a power of 2. The equation used is then:

$$\underline{r}_{sy} = \mathrm{IDFT}[\mathrm{DFT}(y) \odot \mathrm{DFT}(s)^*] = \mathrm{IDFT}[\underline{y}_F \odot \underline{s}^*_F] \quad (7)$$

where:

$\underline{r}_{sy}$ designates the result of the intercorrelation.

$\odot$ designates the term by term product of two vectors.

.* designates the conjugate complex value.

The multicarrier reflectometry according to the invention makes it possible to freely modulate the coefficients $c_i$. Now, when the spectrum of the test signal is no longer equivalent to the STDR reflectometry, parasitic peaks appear when a simple intercorrelation is applied, which makes the reflectogram unusable. This is due to the form of the autocorrelation function $r_{ss}$ of the signal s, an example of which can be seen in FIG. 4 when certain coefficients $c_k$ are zero. In the case of STDR reflectometry, this autocorrelation function is summarised by a single peak. In the present case the secondary lobes that are observed are responsible for the distortion.

The influence of the autocorrelation function is explained by the relationship between the intercorrelation and the autocorrelation:

$$\underline{r}_{sy} = \underline{\hat{h}} * \underline{r}_{ss}$$

where * designates the circular convolution product between the two vectors.

The vector h corresponds to a dicretised version of the pulse response of the diagnosed network. Given that the test signal transmitted by the reflectometry device is sampled with a sampling period $T_e$, the coefficients $h_n$ of the vector can be expressed according to the pulse response h(t) (in the continuous domain) by $$h_n = \int_0^{T_e} h(t + nT_e) dt$$

Using equation (1) there is obtained:

$$\underline{r}_{sy} = \sum_k \alpha_k \underline{r}_{ss}^{\circlearrowleft k} \quad (8)$$

where $\underline{x}^{\circlearrowleft n}$ corresponds to a circular offset of the elements of the vector x by n samples to the right.

Figure 5A:
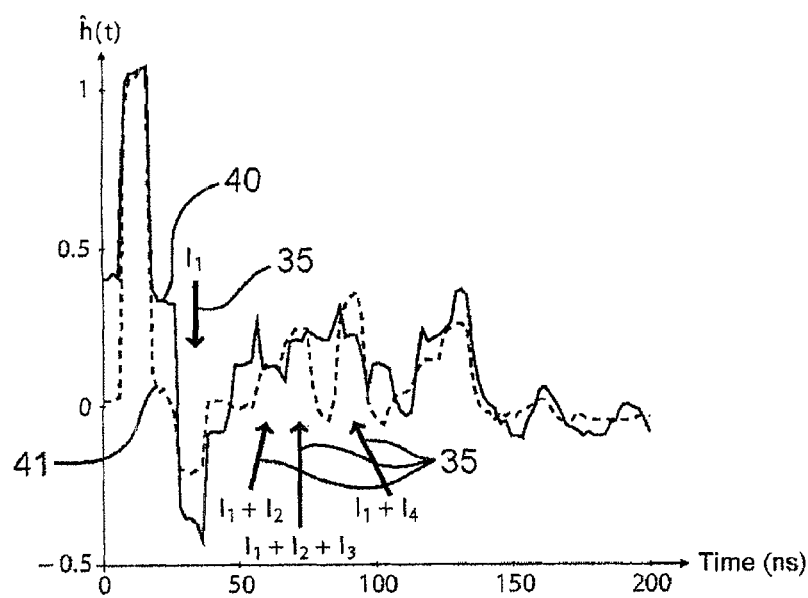
FIGS. 5A and 5B illustrate a typical result obtained with a simple intercorrelation, the autocorrelation of the injected signal corresponding to the curve in FIG. 4.
Figure 5B:
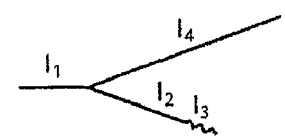

By effecting a simple intercorrelation, a reflectometry result shown in FIG. 5A is obtained, the network of lines $l_1$, $l_2$, $l_3$, $l_4$ used being shown in FIG. 5B. The solid-line curve 40 represents the TDR reflectometry, and the broken-line curve 41 the intercorrelation. Since the peaks of interest cannot then be identified there, the method of the invention uses a post-processing performed in the analysis module 27, which makes it possible to correctly estimate the response of the line h(t). The arrows 35 represent the round-trip length travelled by the signal.

Several cases will now be considered, in which various analysis methods can be applied.

1) Case 1: All the Coefficients ck are Non-Zero

This case, in which the nuisance parts of the spectrum are attenuated but not cancelled out, is the simplest case. It is then possible to apply a "raw deconvolution" algorithm or spectral division algorithm, applying the following equation:

$$h_k^F = \frac{y_k^F}{s_k^F} \quad (9)$$

where $h_k^F$, $y_k^F$, and $s_k^F$ correspond respectively to the samples of the vectors $\underline{\hat{h}}_F$, $\underline{y}_F$ and $\underline{s}_F$ (discrete Fourier trans forms of the vectors ĥ, y and s). The ratio between the maximum and minimum values of the vector $\underline{c}$ is such that:

$$\chi = \frac{\max(\underline{c})}{\min(\underline{c})} \quad (10)$$

This ratio $\chi$, which corresponds to the attenuation factor applied to the nuisance frequencies, must not be too great. The higher this value, the greater must be the number M of average measurements if it wished to keep a correct signal to noise ratio. In practice a ratio $\chi \leq 10$ is considered, which corresponds to a difference of 20 dB between the maximum and minimum energy in the spectral power density of the test signal.

2) Case 2: Certain Coefficients $c_k$ are Equal to 0

When it is wished not to transmit anything in a given frequency band, the corresponding coefficients $c_k$ are cancelled out. In this case, the raw deconvolution method is not applicable. Use is then made, in an original fashion, of a cleaning algorithm or "Clean Algorithm", which is used for channel estimation in the UWB ("Ultra Wide Band") transmissions, as described in the document referenced [5].

Figure 6:
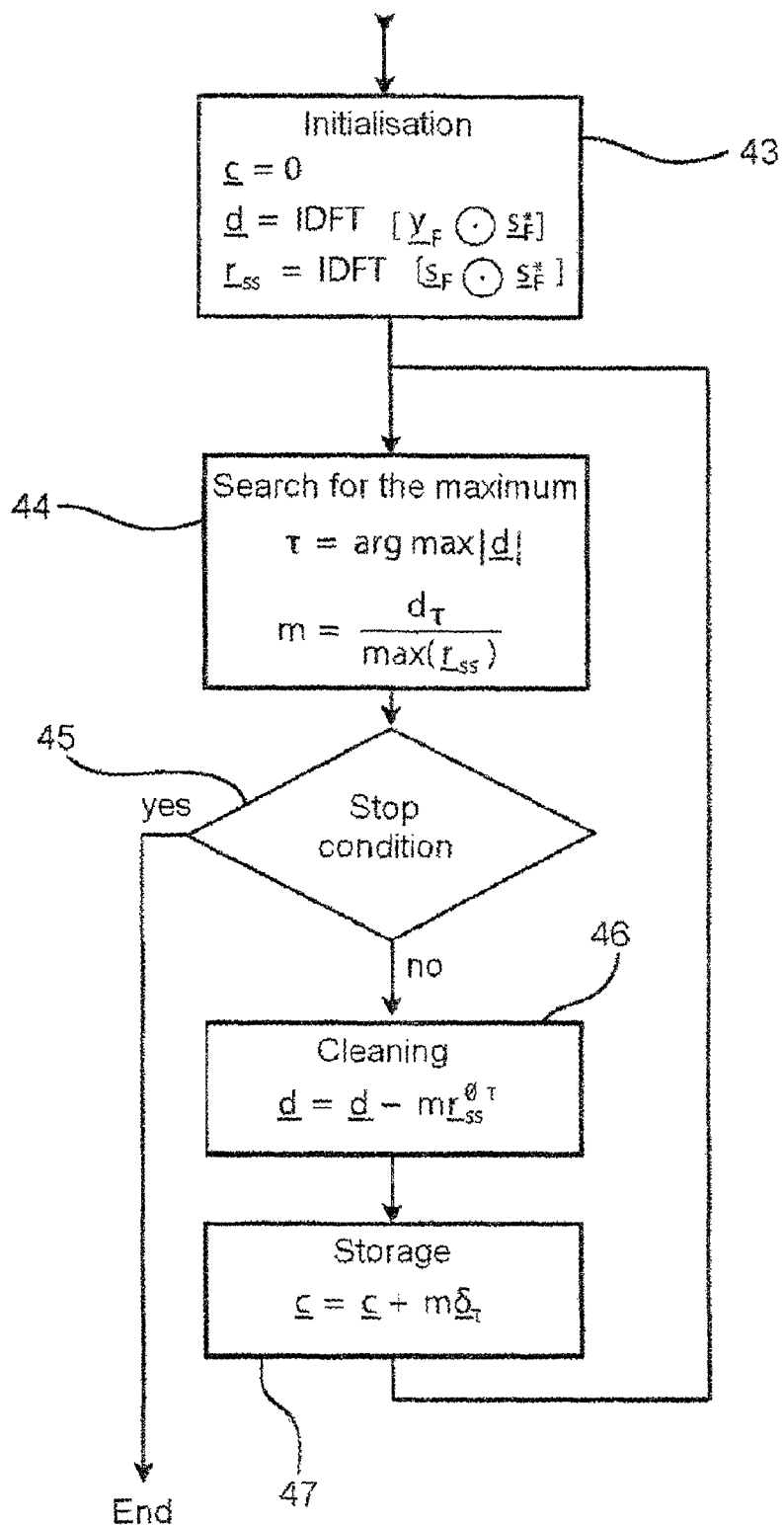
FIG. 6 illustrates the principle of the cleaning algorithm.

In the method of the invention, such a cleaning algorithm makes it possible to take advantage of the particular form of the autocorrelation function. It can be seen in FIG. 4 that, despite the presence of secondary lobes, the central peak is very pronounced. The position of the high-amplitude peaks is visible by virtue of their maximum. The peaks of the smaller amplitudes are on the other hand concealed by the secondary lobes of the high-amplitude peaks. The cleaning algorithm therefore consists of eliminating the contribution of the peaks as they are detected. The general structure of the cleaning algorithm, illustrated in FIG. 6, comprises steps of:
  initialisation (step 43),
  search for the maximum (step 44),
  cleaning (step 46) after a stoppage condition test 45,
  storage (step 47), with:
    $\underline{x}^{\circlearrowleft n}$ corresponds to a circular offset of the elements of the vector x by n samples to the right.
    $r_{ss}$: autocorrelation vector of the signal s.
    $\underline{\delta}_n$: vector all the elements of which are zero except for the $n^{th}$, which is equal to 1.
    C: vector containing the cleaned signal.

The step 44 of search for the maximum makes it possible to estimate the amplitude and position of the peak with the highest amplitude, the contribution of this peak is then eliminated during the cleaning phase and then stored. At the following iteration, the peak with just lower amplitude is detected. The stoppage condition 45 can be tested on two different criteria:
  The amplitude of the error: the stoppage condition then results in the equation: max|d|<$\epsilon$; $\epsilon$ being the residual error threshold. In practice, this threshold $\epsilon$ is chosen to be just higher than the noise level.
  The number of peaks: when the topology of the cable network analysed is known, it is easily possible to estimate the maximum number of relevant peaks in the reflectogram. The algorithm stops when the number of peaks detected reaches a predefined value.

The choice of this stoppage condition is further detailed below.

More precisely, such a cleaning algorithm, which falls in the category of deconvolution algorithms, is particularly suited to pulse-type deconvolution, that is to say when it is considered that the signal sought is composed of distinct pulses or peaks. Use of this algorithm is simple, each iteration is composed of four steps and makes it possible either to estimate the position and amplitude of a new peak or to refine the amplitude of a peak already found previously. Thus the number of iterations is greater than or equal to the number of peaks to be detected.

The cleaning algorithm unfolds according to the following scheme (all of the vectors have used have a length of N samples).

Initialisation (Step 43)
  $d = \mathrm{IDFT}[\underline{y}_F \odot \underline{s}^*_F]$ is the input vector of the algorithm. It corresponds to the signal obtained after suitable filtering. The operator $\odot$ denotes the term by term product of the two vectors and the symbol .* corresponds to the conjugate values.
  $r = \mathrm{IDFT}[\underline{s}_F \odot \underline{s}^*_F]$ corresponds to the deconvolution kernel of the algorithm. It is a case of the (circular) autocorrelation of the test signal s.
  ĥ is initialised to 0 and contains the result of the algorithm. This result is an estimation of the vector h, and hence its notation.

Main Loop
  a. Search for the maximum (step 44)

$$\tau = \mathrm{argmax}|d|$$
$$m = \frac{d_\tau}{\max(r_{ss})}$$

where |.| denotes the absolute value. $\tau$ then corresponds to the position of the maximum in terms of absolute value.

b. Stoppage condition (step 45): this is detailed later; if it is satisfied the algorithm stops here.
  c. Cleaning (step 46)
  For n ranging from 0 to N−1:

$$d_n = d_n - m r_{(n-\tau^N)}$$

$d_n$ and $r_n$ correspond respectively to the elements of the vectors d and r and $\bar{n}^N$ corresponds to n modulo N.

d. Storage (step 47): the peak detected is added to the vector ĥ

$$\hat{h}_\tau = \hat{h}_\tau + m$$

Then step (a) is returned to.

At each iteration the maximum (in absolute value) of the vector d decreases. When the algorithm stops the content of this vector corresponds to the residual error. Thus the test performed conventionally at step (b) is to check whether the maximum of the error is acceptable. Which gives $$\text{stop if: } m < \epsilon$$

In practice, $\epsilon$ is fixed at a value a little higher than the amplitude of the measurement noise. This is the stop condition used in the document referenced [5]. This amounts to saying that it is sought to minimise the residual error.

In the case of the invention, the problem is under-determined, that is to say information corresponding to the zero frequency of the test signal (coefficient $c_n$ at 0) is lacking. It is therefore necessary to compensate for this lack of information by guiding the algorithm more. Use of the cleaning algorithm is therefore different from that of the document referenced [5]; an additional stop condition is necessary.

In practice, it is possible to estimate the maximum number of peaks that can be obtained in the reflectogram according to the topology of the network. An additional stop condition is therefore used on the number of peaks. The number of peaks can be counted by modifying step (d), which becomes:

if $(\hat{h}_\tau = 0)$: $p = p+1$ $\hat{h}_\tau = \hat{h}_\tau + m$

The stop condition is then:

stop if: $p = P$ where P equals the maximum number of peaks.

In the case of the invention, it is ideal to use the two stop conditions. This second test prevents the result from excessively following the data, which in reality are erroneous because of the missing information.

3) Case 3: Association of the Methods Corresponding to Cases 1 and 2

The two analysis methods described above can be associated in the case of applications that require the spectrum of the test signal to be both attenuated over a certain frequency band (case 1) and cancelled out over another frequency band (case 2).

The raw deconvolution (equation 9) is first of all applied, ignoring the points where the spectrum is zero, which results in the following equation:

$$g_k^F = \begin{cases} \dfrac{y_k^F}{s_k^F} & \text{if } s_k^F \neq 0 \\ 0 & \text{otherwise} \end{cases} \quad (11)$$

The vector $\underline{g}$ (inverse discrete Fourier transform of the vector $\underline{g}_F$) is a first estimation of the response, vector $\underline{h}$.

The cleaning algorithm is then applied, the initialisation step being different:

The input signal is the vector $\underline{g}$ such that:

$\underline{d} = \underline{g}$

The autocorrelation function, which no longer exactly corresponds to the signal s, is given by:

$\underline{r}_{ss} = \text{IDFT}(\underline{r}_{ss}^F)$ with:

$$r_k^F = \begin{cases} \dfrac{s_k^F}{s_k^F} & \text{if } s_k^F \neq 0 \\ 0 & \text{otherwise} \end{cases} \text{ and } \underline{r}_{ss}^F = [r_1^F, r_2^F, \ldots, r_N^F]^T \quad (12)$$

Advantage can therefore be taken of these two analysis methods.

Variants of the Invention

The method of the invention assumes that the sampling frequency is the same at the analogue to digital converter 24 and at the digital to analogue converter 22. In practice it is possible, in order to increase the resolution of the reflectogram, to supersample the signal at the analogue to digital converter 24. Thus, at the digital to analogue converter 22, the signal is generated at a frequency Fe but the analogue to digital converter 24 samples the signal measured at a frequency $K.F_e$ where K is an integer.

In this case, the module 25 is averaged in the same way as before. A vector is obtained:

$\underline{y}_{se} = [y_1, y_2, \ldots, y_{KN-1}, y_{KN}]^T$.

This vector is broken into K vectors $\underline{y}_1$ to $\underline{y}_k$ defined by:

$\underline{y}_n = [Y_n, Y_{n+K}, Y_{n+2K}, \ldots, y_{n+(N-1)K}]^T$

The analysis algorithm described above is applied independently to each of these vectors, which gives a series of vectors $\hat{\underline{h}}_1$ to $\hat{\underline{h}}_k$ corresponding to:

$\underline{h}_n = [h_n, h_{n+K}, h_{n+2K}, \ldots, h_{n+(N-1)K}]^T$

The final result is then reconstituted according to the relationship:

$\underline{h}_{se} = [h_1, h_2, \ldots, h_{KN-1}, h_{KN}]^T$

Figure 7A:
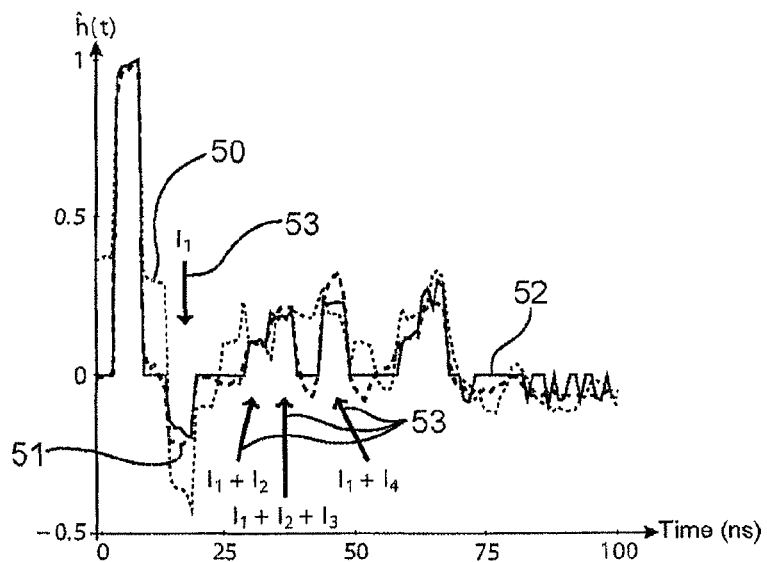
FIGS. 7A and 7B illustrate a typical result obtained in multicarrier reflectometry according to the invention, the autocorrelation of the injected signal corresponding to the curve in FIG. 4.

An example of a result obtained on a type-Y network is illustrated in FIG. 7A.

Figure 7B:
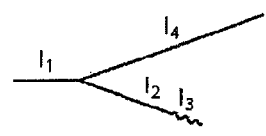
Figure 8:
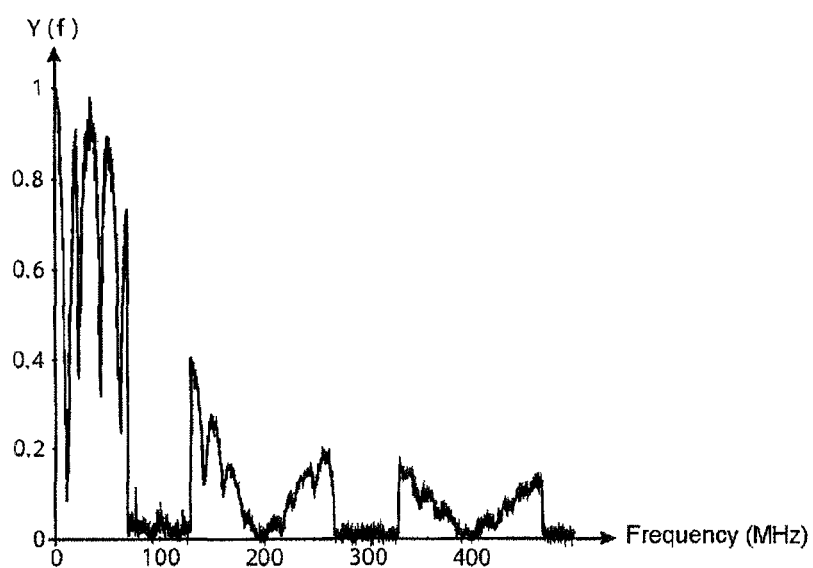
FIG. 8 illustrates the spectrum of the measured signal in the case illustrated in FIGS. 7A and 7B.

This type-Y network of lines $l_1$, $l_2$, $l_3$ and $l_4$ used for the measurement is illustrated in FIG. 7B, the lines $l_1$, $l_2$, $l_4$ being coaxial lines 50Ω and the line $l_3$ a twisted pair. In FIG. 7A, the dotted-line curve 50 represents the inter-correlation, the dashed-line curve 51 represents TDR reflectometry and the solid-line curve 52 the combination of the inter-correlation and the cleaning algorithm. The lengths of this network are $l_1 = 1$ m, $l_2 = 1.5$ m, $l_3 = 0.5$ m, $l_4 = 3$ m. The signal injected corresponds to that defined by equation (6), the spectrum of this signal is zero on the FM band (76 MHz-108 MHz), as can be seen on the curve in FIG. 3. Use of this signal therefore makes it possible not to interfere with the radio transmissions on this band when the signal is transmitted continuously. The spectrum of the measured signal, which is sent by the line, is shown in FIG. 8. The "cancelled bands", which can be seen in FIG. 3, are found therein. The only component visible in these frequency bands corresponds to the noise. In the non-zero bands the anti-resonances relating to the network being diagnosed are observed.

It is possible in addition to place an analogue filter after the digital to analogue converter 22 before the injection of the signal into the line 23, which attenuates the spectrum beyond the sampling frequency (for example 200 MHz). If the cutoff frequency of this filter is not too low, the reflectometry result remains correct.

The post-processing of the method of the invention makes it possible to dispense with the secondary lobes of the autocorrelation function, illustrated in FIG. 4. The solid-line curve 52 in FIG. 7A represents the final result of the method of the invention and is to be compared with the dashed-line curve 51 of the TDR reflectometry (affected by no distortion). The arrows represent the round-trip length travelled by the signal.

Implementation of the Method of the Invention

The results obtained above were obtained with implementation of the method of the invention in Matlab software, the injection and recovery of the signal taking place via laboratory apparatus.

Implementation of the method of the invention requires a digital system for synthesising the signal and post-processing in order to execute the various associated algorithms. Integration of the digital part can take place in a microcontroller, a prediffused array programmable by the user (FPGA or "Field Programmable Gate Array"), a specific integrated circuit (ASIC or "Application Specific Integrated Circuit"), and a work station or any other digital platform adapted to the application. The transmission and recovery of the signal, which is done via a pair consisting of digital to analogue converter (DAC) and analogue to digital converter (ADC), can be done by laboratory equipment (oscilloscope and generator). It is however possible to opt for converters included in a microcontroller or an electronic card with FPGA or microprocessor.

REFERENCES

[1] "Analysis of spread spectrum time domain reflectometry for wire fault location" by P. Smith, C. Furse, and J. Gunther. (Sensors Journal, IEEE, 5(6), pages 1469-1478, December 2005).

[2] "Noise-domain reflectometry for locating wiring faults" by Chet Lo and C. Furse. (Electromagnetic Compatibility, IEEE Transactions on, 47(1), pages 97-104, February 2005).

[3] "Multicarrier reflectometry" by S. Naik, C. M. Furse, and B. Farhang-Boroujeny. (Sensors Journal, IEEE, 6(3), pages 812-818, June 2006).

[4] "Synthesis of low-peak-factor signals and binary sequences with low autocorrelation" by M. R. Schroeder. (IEEE Transactions on Information Theory, 16, pages 85-89, January 1970).

[5] "Detection and localization of defects in shielded cables by time-domain measurements with uwb pulse injection and clean algorithm postprocessing" by C. Buccella, M. Feliziani, and G. Manzi. (IEEE Transactions on Electromagnetic Compatibility, 46(4), pages 597-605, November 2004).

The invention claimed is:

1. A multicarrier reflectometry device for on-line diagnosis of at least one transmission line, comprising:
   a transmission part connected to the transmission line, which comprises successively:
   a module for parameterizing a test signal $S_F$, such that:

$$s_F = [0, c_1 e^{j\theta_1}, c_2 e^{j\theta_2}, \ldots, C_{N/2-1} e^{j\theta_{N/2-1}}, C_{N/2}, C_{N/2-1} e^{j\theta_{N/2-1}}, C_{N/2-2} e^{j\theta_{N/2-2}}, \ldots, c_1 e^{j\theta_1}]^T,$$

a module for synthesising this test signal by inverse discrete Fourier transform, and
   a digital to analog converter, connected to the transmission line, which delivers to the transmission line an analog test signal x(t) that is a periodic signal;
   a detection part, connected to the transmission line, which comprises successively:
   an analog to digital converter, connected to the transmission line, which receives a measured signal $x_s(t)$ and digitizes the measured signal $8x_s(t)$,
   a discrete Fourier transform module, and
   an analysis module containing a deconvolution module, which performs a post-processing of the measured signal thus transformed using the test signal $S_F$ and which makes it possible to estimate the transmission response h(t), such that $x_s(t) = x(t) * h(t)$, * representing the convolution product.

2. A device according to claim 1, wherein the detection part comprises an averaging module situated at an output of the analog to digital converter.

3. A device according to claim 1, wherein the analysis module comprises means for intercorrelation between the transmitted signal and the measured signal.

4. A device according to claim 1, wherein the post-processing means effect a raw deconvolution, applying following equation:

$$h_k^F = \frac{y_k^F}{s_k^F}$$

in which $h_k^F$, $y_k^F$, and $s_k^F$ correspond respectively to the samples of the vectors $\hat{h}_F$, $y_F$ and $s_F$, discrete Fourier transforms of the vectors $\bar{h}$, y and s, each period of the measured signal $x_s(t)$ making it possible to obtain a series of vectors $y_m$ of length N, the average obtained by an averaging of plural periods being stored in a vector $\bar{y}$.

5. A device according to claim 1, wherein the post-processing means implements a cleaning algorithm, which comprises:
   initialization;
   search for a maximum;
   cleaning after a stoppage condition test; and
   storage.

6. A device according to claim 1, wherein the analog to digital converter comprises supersampling means.

7. A device according to claim 1, further comprising analog filtering means after the digital to analog converter.

8. A device according to claim 4, wherein the post-processing means implements a cleaning algorithm, which comprises:
   initialization;
   search for a maximum;
   cleaning after a stoppage condition test; and
   storage.

9. A multicarrier reflectometry method for on-line diagnosis of at least one transmission line, comprising:
   in a transmission in the transmission line:
   parameterizing a test signal $S_F$ such that:

$$s_F = [0, c_1 e^{j\theta_1}, c_2 e^{j\theta_2}, \ldots, C_{N/2-1} e^{j\theta_{N/2-1}}, C_{N/2}, C_{N/2-1} e^{j\theta_{N/2-1}}, C_{N/2-2} e^{j\theta_{N/2-2}}, \ldots, c_1 e^{j\theta_1}]^T,$$

synthesising the test signal by inverse discrete Fourier transform, and
   digital to analog conversion that delivers to the transmission line an analog test signal x(t) that is a periodic signal;
   in a detection for the transmission line:
   analog to digital conversion of the measured signal $x_s(t)$ connected to this transmission line,
   a discrete Fourier transform,
   analysis enabling a deconvolution, which effects a post-processing of the signal thus transformed using the test signal $S_F$ and which makes it possible to estimate the response h(t) of the transmission line, such that $x_s(t) = x(t) * h(t)$, * representing a convolution product.

10. A method according to claim 9, further comprising an averaging after the analog to digital conversion.

11. A method according to claim 9, wherein the analysis comprises an intercorrelation phase between the transmitted signal and the measured signal.

12. A method according to claim 9, wherein the post processing phase performs a raw deconvolution, applying the following equation:

$$h_k^F = \frac{y_k^F}{s_k^F}$$

in which $h_k^F$, $y_k^F$, and $s_k^F$ correspond respectively to the samples of the vectors $\hat{h}_F$, $y_F$ and $s_F$, discrete Fourier transforms of the vectors $\bar{h}$, y and s, each period of the measured signal $x_s(t)$ making it possible to obtain a series of vectors $y_m$, of length N, the average obtained by an averaging of several periods being stored in a vector $\bar{y}$.

13. A method according to claim 9, wherein the post-processing implements a cleaning algorithm, which comprises:
   initialization;
   search for a maximum;
   cleaning after a stoppage condition test; and
   storage.

14. A method according to claim 12, wherein the post-processing implements a cleaning algorithm, which comprises:
 initialization;
 search for a maximum;
 cleaning after a stoppage condition test; and
 storage.

15. A method according to claim 10, wherein the analog to digital conversion comprises a super-sampling phase.

16. A method according to claim 10, further comprising an analog filtering phase after the digital to analog conversion.

* * * * *